United States Patent
Lee et al.

(10) Patent No.: US 11,670,397 B2
(45) Date of Patent: Jun. 6, 2023

(54) OUTPUT IMPEDANCE CALIBRATION, AND RELATED DEVICES, SYSTEMS, AND METHODS

(71) Applicant: Micron Technology, Inc., Boise, ID (US)

(72) Inventors: Hyunui Lee, Tokyo (JP); Masayoshi Yamazaki, Kanagawa (JP)

(73) Assignee: Micron Technology, Inc., Boise, ID (US)

(*) Notice: Subject to any disclaimer, the term of this patent is extended or adjusted under 35 U.S.C. 154(b) by 39 days.

(21) Appl. No.: 17/238,561

(22) Filed: Apr. 23, 2021

(65) Prior Publication Data
US 2022/0343996 A1   Oct. 27, 2022

(51) Int. Cl.
G11C 29/50    (2006.01)
G11C 7/10     (2006.01)
H03K 19/00    (2006.01)

(52) U.S. Cl.
CPC ........ *G11C 29/50008* (2013.01); *G11C 7/109* (2013.01); *G11C 7/1057* (2013.01); *G11C 7/1063* (2013.01); *G11C 7/1069* (2013.01); *G11C 7/1084* (2013.01); *G11C 7/1096* (2013.01); *H03K 19/0005* (2013.01); *G11C 2207/2254* (2013.01)

(58) Field of Classification Search
None
See application file for complete search history.

(56) References Cited

U.S. PATENT DOCUMENTS

| | | | |
|---|---|---|---|
| 2010/0308861 A1* | 12/2010 | Lee | H04L 25/0278 326/82 |
| 2013/0162286 A1* | 6/2013 | Lee | H03K 19/018571 326/30 |
| 2017/0331476 A1* | 11/2017 | Cho | G11C 29/025 |
| 2021/0099172 A1* | 4/2021 | Kang | H03K 19/0005 |

OTHER PUBLICATIONS

Hyunui Lee, Output Impedance Calibration, and Related Devices, Systems, and Methods, filed Jan. 4, 2021, U.S. Appl. No. 17/141,031, 35 pages.

* cited by examiner

*Primary Examiner* — Anh Q Tran
(74) *Attorney, Agent, or Firm* — TraskBritt

(57) ABSTRACT

A device may include a ZQ calibration circuit. The ZQ calibration circuit may include a first register configured to store a first impedance code generated responsive to a ZQ calibration command. The ZQ calibration circuit may also include a second register configured to store a shift value. Further, the ZQ calibration circuit may include a compute block configured to generate a second impedance code based on the first impedance code and the shift value. Systems and related methods of operation are also described.

20 Claims, 10 Drawing Sheets

OUTPUT IMPEDANCE CALIBRATION, AND RELATED DEVICES, SYSTEMS, AND METHODS

TECHNICAL FIELD

Embodiments of the disclosure relate to impedance calibration. Yet more specifically, some embodiments of the disclosure relate to output impedance calibration of microelectronic devices, and related methods, devices, and systems.

BACKGROUND

Memory devices are typically provided as internal, semiconductor, integrated circuits in computers or other electronic systems. There are many different types of memory including, for example, random-access memory (RAM), read only memory (ROM), dynamic random access memory (DRAM), synchronous dynamic random access memory (SDRAM), resistive random access memory (RRAM), double data rate memory (DDR), low power double data rate memory (LPDDR), phase change memory (PCM), and Flash memory.

Electronic systems, such as memory systems, often include one or more types of memory, and that memory is typically coupled to one or more communications channels within a memory system. Time varying signals in such systems are utilized to transfer information (e.g., data) via one or more conductors often referred to as signal lines. These signal lines are often bundled together to form a communications bus, such as an address or data bus.

To meet demands for higher performance operating characteristics, designers continue to strive for increasing operating speeds to transfer data across communications buses within electronic systems. One issue with increased data transfer rates is maintaining signal integrity during bursts of data on communication buses of electronic (e.g., memory) systems. As transfer rates increase, impedance characteristics of a communication bus may become more pronounced, and signal waveforms may begin to spread out and/or reflections may occur at locations of unmatched impedance on the communication bus. Signal integrity (e.g., data integrity) may be affected when an impedance (e.g., output impedance) of one or more nodes of a memory device coupled to a communication bus is not properly matched to an impedance of the communications bus.

DETAILED DESCRIPTION

Figure 1:
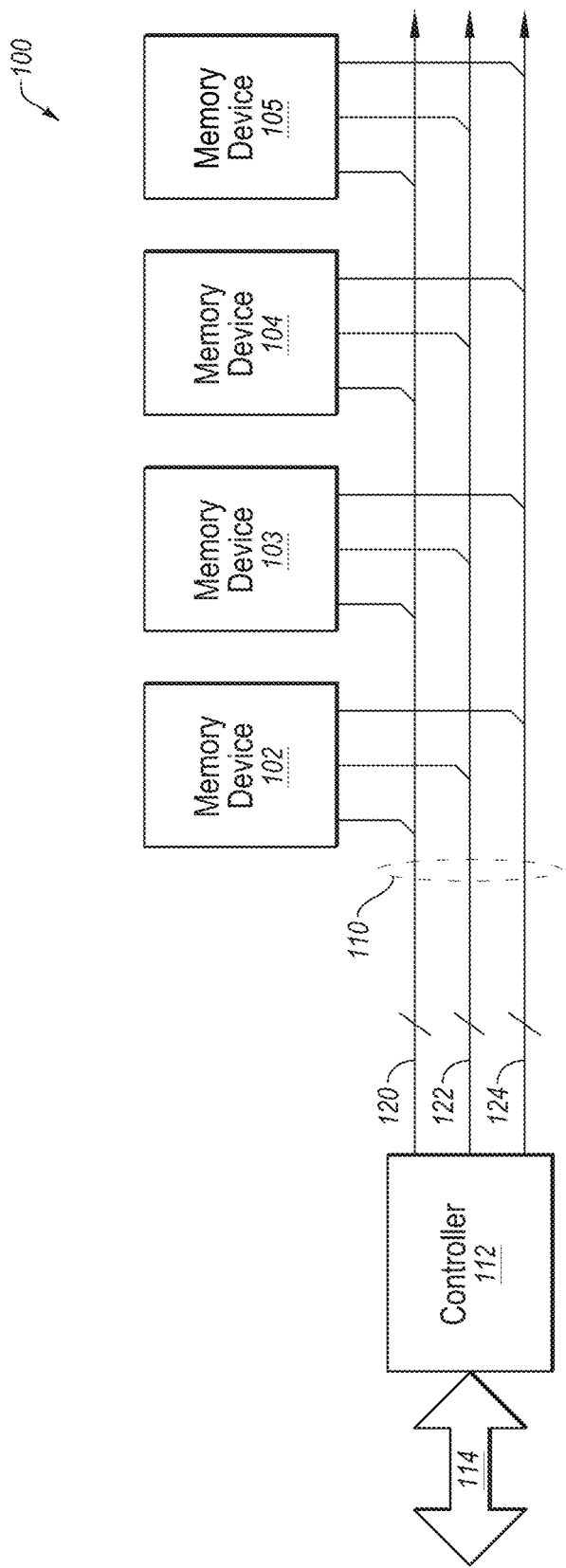
FIG. 1 is a block diagram of an example memory system including a number of memory devices, in accordance with various embodiments of the disclosure.

A memory device (e.g., of a memory system) may include an output device including one or more output drivers for driving signals (e.g., off-chip) during data transmission. As will be appreciated, various memory systems, including, for example, two dual in-line memory modules (DIMMs) per channel (2DPC) memory systems and four DIMMs per channel (4DPC) memory systems, may include variable internal characteristics and may exhibit variable channel performance responses (e.g., during data transmission). Channel performance may impact signal integrity, and although a memory system may comply with a design specification, signal integrity of a memory system may be less than ideal (e.g., due to less than ideal channel performance). In some conventional devices, systems, and methods, signal integrity issues are addressed via manual adjustment of output driver circuitry (e.g., manual adjustment of ON resistance (Ron) of an output driver). However, manual adjustment of output driver circuitry requires additional resources and time and may result in other issues (e.g., design fragments due to variable characteristics).

As disclosed herein, various embodiments relate to automated impedance calibration (e.g., for semiconductor device read operations). According to various embodiments, during a first mode (e.g., during power-up of a semiconductor device), a first impedance calibration operation may be performed (e.g., in response to a long calibration command) to determine a first calibration code (e.g., for one or more drivers of the semiconductor device). Further, during the first mode, a testing operation may be performed to determine a second calibration code (e.g., based on measured signal integrity responses of the semiconductor device). Furthermore, a difference (a "shift value") between the first calibration code and the second calibration code may be determined and possibly stored (e.g., in a register). Further, during a second mode (e.g., during operation of the semiconductor device), a second impedance calibration operation may be performed (e.g., in response to a short calibration command) to determine a third calibration code. Moreover, during the second mode, a fourth calibration code may be determined based on the third calibration code and the shift value. More specifically, the third calibration code may be updated based on the shift value to generate the fourth calibration code. Accordingly, during operation of the semiconductor device, one or more drivers of the semiconductor device may be tuned (e.g., independent of a host) based on the shift value, which was determined via a previously performed testing operation.

Various embodiments of the disclosure may enhance, and possibly optimize, signal integrity associated with semiconductor devices (e.g., memory devices and/or memory systems). For example, in some embodiments, signal integrity of a semiconductor device may be enhanced, and possibly optimized, without manual adjustment (e.g., without requiring adjustment via a designer and/or a user) of an output impedance. Further, according to some embodiments, undesirable design fragments may be avoided (e.g., via automated impedance calibration, as described herein). As will be appreciated, various embodiments disclosed herein may be used in place of (i.e., may replace) traditional calibration operations.

Although various embodiments are described herein with reference to memory systems and/or memory devices, the disclosure is not so limited, and the embodiments may be generally applicable to microelectronic systems and/or devices that may or may not include semiconductor devices and/or memory devices. Embodiments of the disclosure will now be explained with reference to the accompanying drawings.

FIG. 1 illustrates an example memory system 100, according to various embodiments of the disclosure. Memory system 100 includes a number of memory devices 102-105 coupled to a communication bus 110 (e.g., a system bus). Each memory device 102-105 may include one or more memory die, and collectively, memory devices 102-105 may be referred to as a dual in-line memory module (DIMM), a multi-chip package (MCP), or a package on package (POP). Each memory device 102-105 of memory system 100 may include an output driver including a number of unit drivers and associated calibration circuitry, as described more fully below.

Memory system 100 further includes a controller 112 coupled to each memory device 102-105 via communication bus 110. Controller (also referred to herein as a "host") 112, which may include a processor or any other type of controller, may be configured to control and/or regulate various operations of memory system 100, as well as provide interactivity with another device or system coupled to memory system 100 via an interface 114.

Communication bus 110 may include one or more of an address bus 120, a data bus 122, and a control signal bus 124. In some embodiments, memory devices 102-105, communication bus 110, and controller 112 may be configured (e.g., physically arranged and mounted) on a printed circuit board (PCB).

Figure 2:
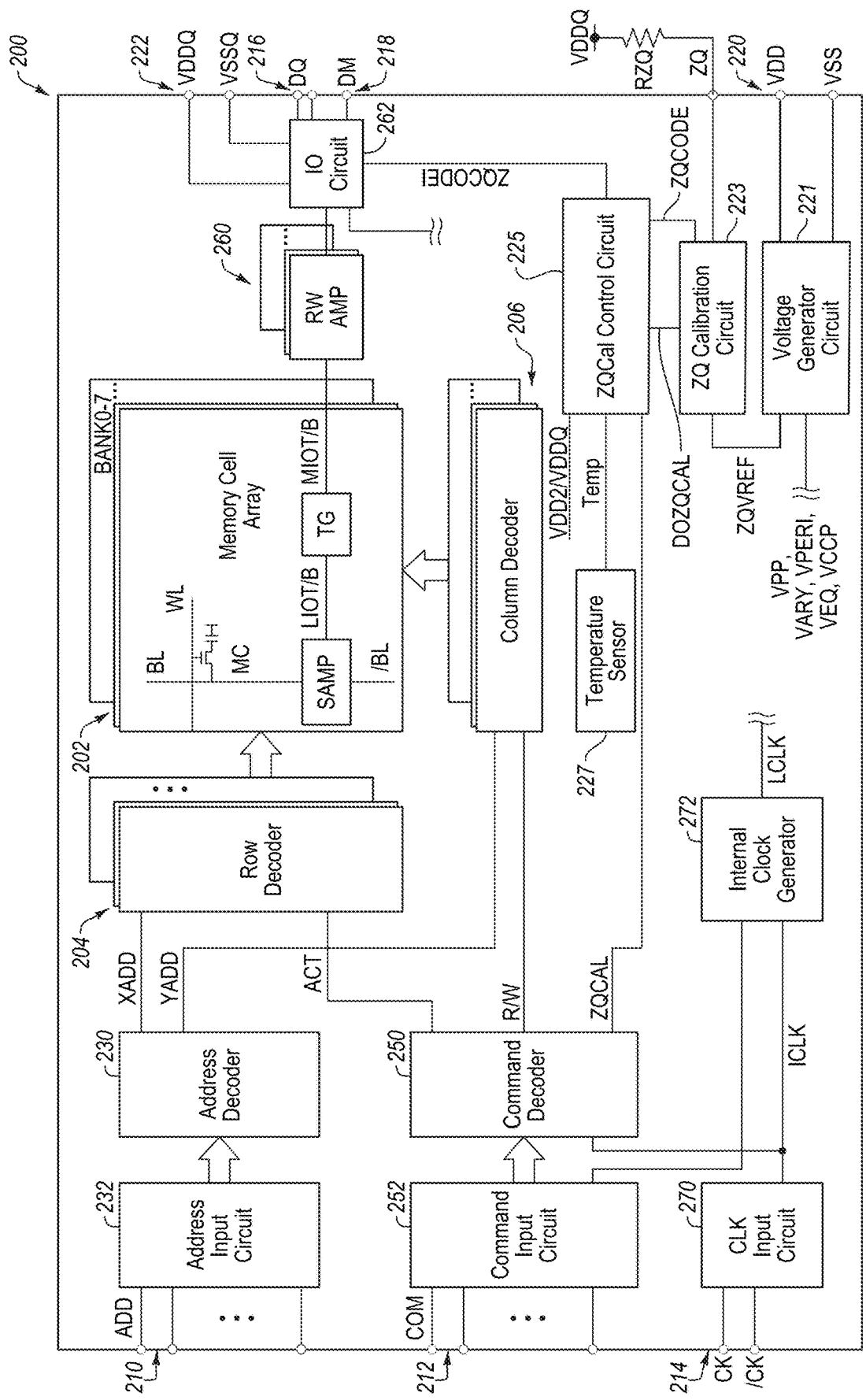
FIG. 2 is a functional block diagram of an example memory device, according to various embodiments of the disclosure.

FIG. 2 is a functional block diagram illustrating an example memory device 200, in accordance with at least one embodiment of the disclosure. Memory device 200 may include, for example, a DRAM (dynamic random access memory), a SRAM (static random access memory), a SDRAM (synchronous dynamic random access memory), a DDR SDRAM (double data rate SDRAM, such as a DDR4 SDRAM and the like), or a SGRAM (synchronous graphics random access memory). For example, one or more of memory devices 102-105 of FIG. 1 may include memory device 200. Memory device 200, which may be integrated on a semiconductor chip, may include a memory array 202.

In the embodiment of FIG. 2, memory array 202 is shown as including eight memory banks BANK0-7. More or fewer banks may be included in memory array 202 of other embodiments. Each memory bank includes a number of access lines (word lines WL), a number of data lines (bit lines BL and /BL), and a number of memory cells MC arranged at intersections of the number of word lines WL and the number of bit lines BL and /BL. The selection of a word line WL may be performed by a row decoder 204 and the selection of the bit lines BL and /BL may be performed by a column decoder 206. In the embodiment of FIG. 2, row decoder 204 may include a respective row decoder for each memory bank BANK0-7, and column decoder 206 may include a respective column decoder for each memory bank BANK0-7.

Bit lines BL and /BL are coupled to a respective sense amplifier SAMP. Read data from bit line BL or /BL may be amplified by sense amplifier SAMP, and transferred to read/write amplifiers 260 over complementary local data lines (LIOT/B), a transfer gate (TG), and complementary main data lines (MIOT/B). Conversely, write data outputted from read/write amplifiers 260 may be transferred to sense amplifier SAMP over complementary main data lines MIOT/B, transfer gate TG, and complementary local data lines LIOT/B, and written in memory cell MC coupled to bit line BL or /BL.

Memory device 200 may be generally configured to be received various inputs (e.g., from an external controller) via various terminals, such as address terminals 210, command terminals 212, clock terminals 214, data terminals 216, and data mask terminals 218. Memory device 200 may include additional terminals such as a power supply terminal 220 and a power supply terminal 222.

During a contemplated operation, one or more command signals COM, received via command terminals 212, may be conveyed to a command decoder 250 via a command input circuit 252. Command decoder 250 may include a circuit configured to generate various internal commands via decoding the one or more command signals COM. Examples of the internal commands include an active command ACT and a read/write signal R/W.

Further, one or more address signals ADD, received via address terminals 210, may be conveyed to an address decoder 230 via an address input circuit 232. Address decoder 230 may be configured to supply a row address XADD to row decoder 204 and a column address YADD to column decoder 206. Although command input circuit 252 and address input circuit 232 are illustrated as separate circuits, in some embodiments, address signals and command signals may be received via a common circuit.

Active command ACT may include a pulse signal that is activated in response to a command signal COM indicating row access (e.g., an active command). In response to active signal ACT, row decoder 204 of a specified bank address may be activated. As a result, the word line WL specified by row address XADD may be selected and activated.

Read/write signal R/W may include a pulse signal that is activated in response to a command signal COM indicating column access (e.g., a read command or a write command). In response to the read/write signal R/W, column decoder 206 may be activated, and the bit line BL specified by the column address YADD may be selected.

In response to active command ACT, a read signal, a row address XADD, and a column address YADD, data may be read from the memory cell MC specified by the row address XADD and the column address YADD. The read data may be output via sense amplifier SAMP, transfer gate TG, read/write amplifiers 260, an input/output circuit 262, and data terminals 216. Further, in response to active command ACT, a write signal, a row address XADD, and a column address YADD, write data may be supplied to memory array 202 via data terminals 216, input/output circuit 262, read/ write amplifiers 260, transfer gate TG, and sense amplifier SAMP. The write data may be written to the memory cell MC specified by the row address XADD and the column address YADD.

Clock signals CK and /CK may be received via clock terminals 214. A clock input circuit 270 may generate internal clock signals ICLK based on the clock signals CK and /CK. Internal clock signals ICLK may be conveyed to various components of memory device 200, such as command decoder 250 and an internal clock generator 272. Internal clock generator 272 may generate internal clock signals LCLK, which may be conveyed to input/output circuit 262 (e.g., for controlling the operation timing of input/output circuit 262). Further, data mask terminals 218 may receive one or more data mask signals DM. When data mask signal DM is activated, overwrite of corresponding data may be prohibited.

Power supply voltages VDD and VSS may be supplied to an internal voltage generator circuit 221, which may provide various internal voltages VPP, VARY, VPERI, VEQ, and VCCP. Memory device 200 may also include a calibration terminal ZQ, which is coupled to a power supply potential VDDQ via a reference resistor RZQ. Reference resistor RZQ, which may be provided on, for example only, a memory module substrate or a motherboard, includes a resistor that is referenced during a calibration operation. The impedance of reference resistor RZQ is used as a reference impedance for a ZQ calibration circuit 223. In some examples, voltage generator circuit 221 provides a reference potential ZQVREF signal to ZQ calibration circuit 223. When calibration circuit 223 is activated (e.g., by a calibration signal DOZQCAL), calibration circuit 223 performs a calibration operation by referencing the impedance of reference resistor RZQ and reference potential ZQVREF. In performing the calibration operation, ZQ calibration circuit 223 may provide a ZQ calibration code ZQCODE. In some examples, ZQ calibration code ZQCODE may include multiple bits specifying the impedance of respective pull-up or pull-down circuits in input/output circuit 262.

In some examples, memory device 200 may include a ZQ calibration control circuit 225 coupled to ZQ calibration circuit 223 and input/output circuit 262. For example, command decoder 250 may provide a ZQ calibration command ZQCAL to ZQ calibration control circuit 225. Upon arrival of each ZQCAL command, ZQ calibration control circuit 225 may be configured to provide a ZQ calibration code ZQCODE1 to input/output circuit 262. In some examples, ZQ calibration code ZQCODE1 may be ZQ calibration code ZQCODE provided by ZQ calibration circuit 223 and supplied by ZQ calibration control circuit 225 to input/output circuit 262. Alternatively, and/or additionally, ZQCODE1 may be a pre-stored ZQ calibration code retrieved by ZQ calibration control circuit 225 to provide to input/output circuit 262. In other words, ZQ calibration control circuit 225 may be configured to activate a ZQ calibration and supply the calibration code provided by ZQ calibration circuit 223 to input/output circuit 262 or skip the ZQ calibration and retrieve a pre-stored calibration code that is provided to input/output circuit 262.

In some examples, ZQ calibration control circuit 225 may pre-store multiple ZQ calibration codes provided by ZQ calibration circuit 223 from previous calibrations or an initial calibration table obtained in a back-end testing. In some examples, ZQ calibration control circuit 225 may be provided with a voltage signal and a temperature signal TEMP respectively indicative of the voltage condition and the temperature condition of memory device 200. For example, the voltage signal may be indicative of a power supply voltage of memory device 200. Temperature signal TEMP may be indicative of an operating temperature of memory device 200. For example, temperature signal TEMP may be provided by a temperature sensor 227. When pre-storing the ZQ calibration code, ZQ calibration control circuit 225 may also store an operating condition, such as a voltage/temperature condition associated with the ZQ calibration code. According to various embodiments, as described in more detail below, memory device 200 may include one or more unit drivers and associated circuitry (e.g., ZQ calibration circuitry) for calibrating the one or more unit drivers. More specifically, as described in more detail below, a desired output impedance (e.g., for read operations) of the one or more unit drivers of memory device 200 may be determined (i.e., via one or more calibration and/or training operations) such that memory device 200 may exhibit acceptable (e.g., desired and/or optimal) signal integrity during device operation.

Figure 3:
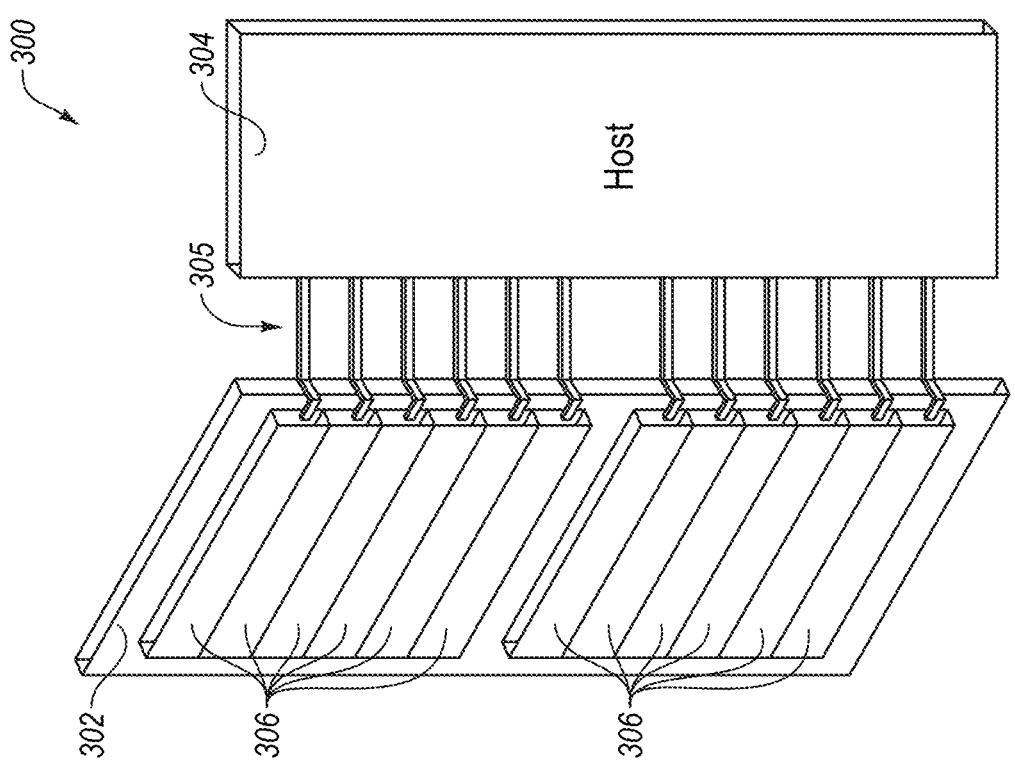
FIG. 3 depicts an example memory system including a dual in-line memory module coupled to a host, in accordance with various embodiments of the disclosure.

FIG. 3 depicts a memory system 300 including a dual in-line memory module (DIMM) 302 coupled to a host 304, according to various embodiments of the disclosure. DIMM 302 includes a number of units 306 for conveying information (e.g., DQ, DQS, addresses, and/or commands) from the memory device to host (also referred to herein as a "controller") 304 via a number of channels 305. Each unit 306 may include, for example, data (DQ) terminals, data strobe (DQST) terminals, and/or data strobe complement (DQSC) terminals.

As will be appreciated, each unit 306 may include a number of terminals, pads, and/or pins (not shown in FIG. 3). As will be appreciated, in some examples, signal integrity (e.g., for data transmission via one or more channels 305) may vary across units 306 of memory system 300. Further, in some examples, signal integrity (e.g., for data transmission via one or more channels 305) may vary across a single unit 306.

Figure 4A:
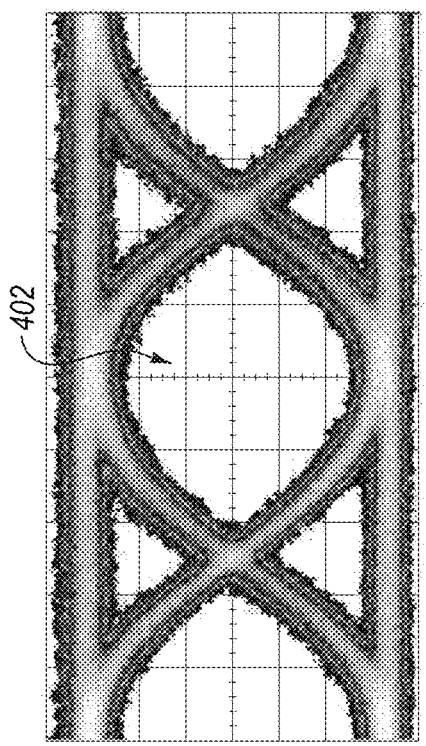
FIGS. 4A and 4B each depict an example channel performance response of a memory system.
Figure 4B:
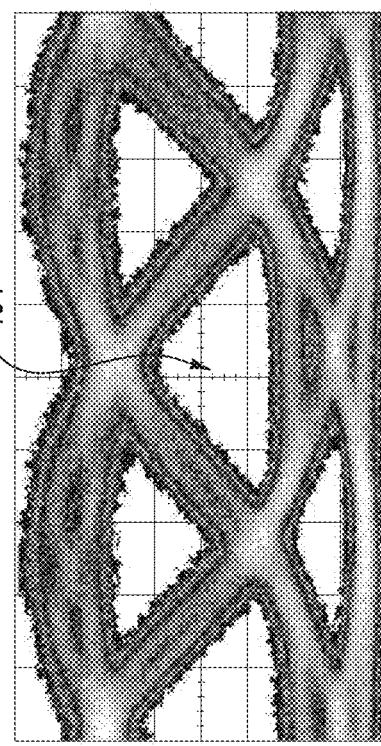

FIGS. 4A and 4B each depict an example channel performance response of a memory system. More specifically, FIGS. 4A and 4B each depict a signal integrity result (also referred to herein as "signal integrity," "signal integrity response," "channel performance," "channel performance response") for a channel (e.g., channel 305 of FIG. 3) of a memory system (e.g., memory system 300 of FIG. 3). As will be appreciated, a data eye 402 of FIG. 4A is larger compared to a data eye 404 of FIG. 4B, and thus, the signal integrity result depicted in FIG. 4A is improved relative to the signal integrity result depicted in FIG. 4B.

Figure 5:
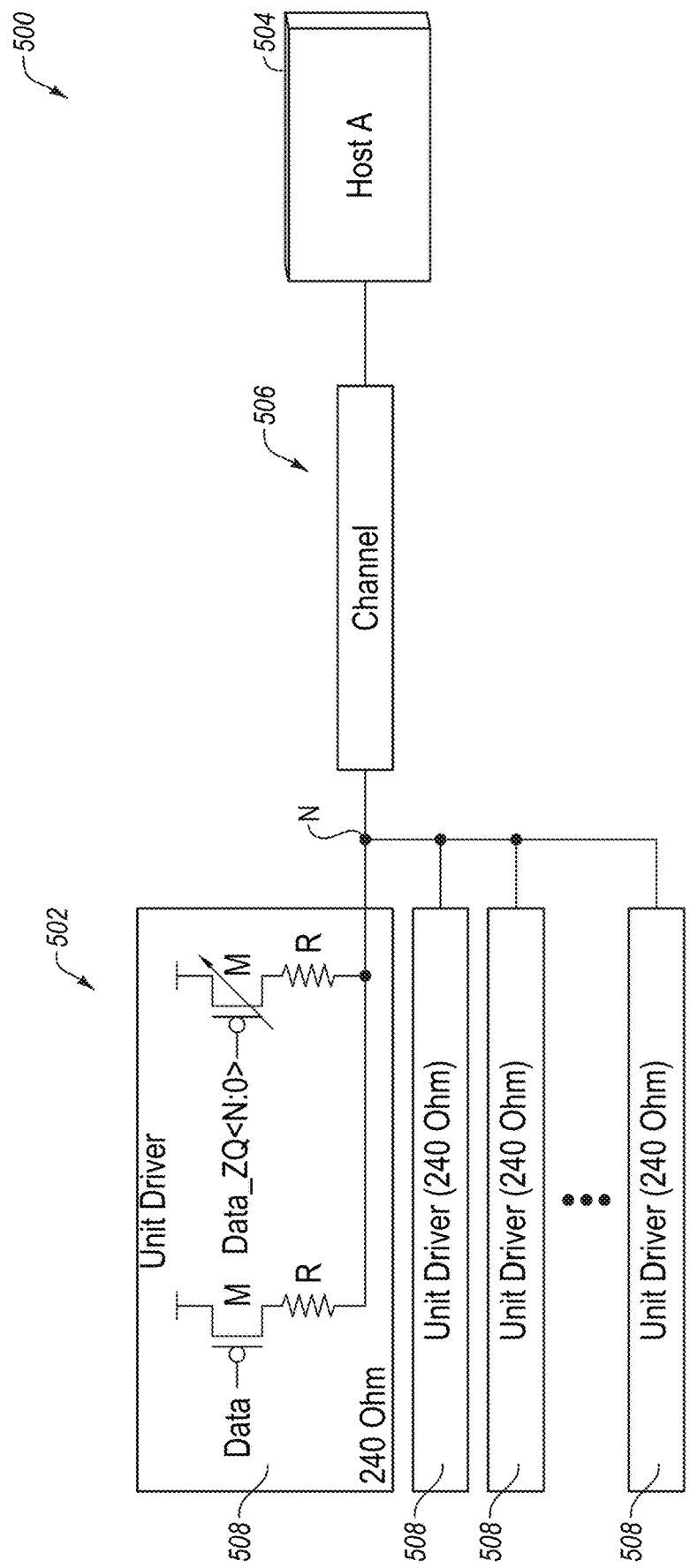
FIG. 5 depicts an example memory system including an output driver of a memory device coupled to a host.

FIG. 5 depicts a memory system 500 including an output driver 502 (e.g., of a memory device (e.g., a DRAM)) coupled to a host 504 via a channel 506. Output driver 502 includes a number of drivers 508 coupled in parallel. Each driver (also referred to herein as "unit driver") 508 may have the same or similar circuit structures. More specifically, each driver 508 includes a number of transistors M. Further, each driver 508 includes a resistor R coupled between a terminal (e.g., a source or a drain) of an associated transistor M and a node N (also referred to herein as an "output node," a "DQ node," a "DQ pin," or a "DQ pad"). As will be appreciated, a number of operation signals may be supplied to the gates of transistors M to select a number of transistors. In other words, each transistor M may be individually controlled (i.e., turned on/off) based on an associated operation signal. In this example, each driver 508 has an output impedance of 240 ohms.

As will be appreciated, signal integrity (i.e., for a memory device read operation) may be affected by an output resistance Ron (also referred to as "on resistance") of an output driver and possibly system characteristics (e.g., channel characteristics) associated with the output driver. As will also be appreciated, in some systems, a value for output resistance Ron may be 240 Ohms, which may be adjusted via output impedance (ZQ) calibration. Although a value for output resistance Ron may be adjusted (e.g., according to a design specification), signal integrity may be less than ideal (e.g., due to less than ideal channel performance). Thus, according to at least some embodiments, a value for output resistance Ron may be adjusted (e.g., from a specification value) (e.g., to improve signal integrity). More specifically, according to at least some embodiments, a value for output resistance Ron may be adjusted via an automated calibration process (e.g., without requiring manual adjustment).

In some cases, signal integrity may be enhanced (e.g., optimized) with a Ron value that is out of a specification range. For example, a Ron value of 220 Ohms may provide optimal results even if a design specification includes a Ron value of 240 Ohms and an allowable variation of 5% (i.e., 228-252 Ohms). As noted above, conventional systems, devices, and methods may tune output resistance Ron via a manual process, which requires additional resources and/or time.

Figure 6:
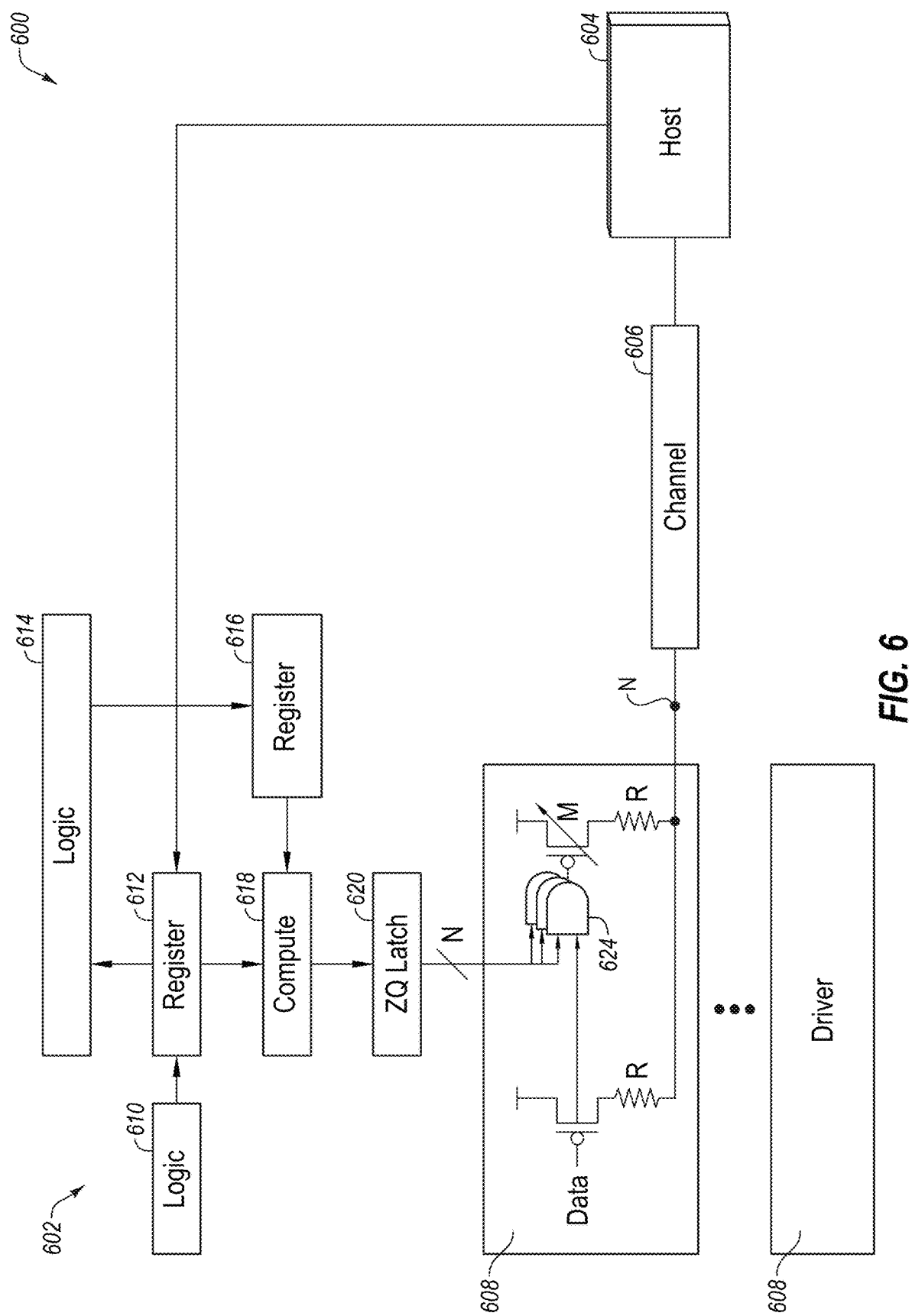
FIG. 6 depicts an example memory system including an output driver of a memory device coupled to a host, according to various embodiments of the disclosure.

FIG. 6 depicts an example memory system 600, according to various embodiments of the disclosure. Memory system 600 includes ZQ calibration circuit 602 (e.g., ZQ calibration circuit 223 of memory device 200 of FIG. 2).

Memory system 600 further includes a number of drivers 608, wherein each driver (also referred to herein as "unit driver") 608 includes a number of logic gates and a number of transistors M. For example, input/output circuit 262 of FIG. 2 may include drivers 608. For example, with reference to FIGS. 3 and 6, ZQ calibration circuit 602 and/or driver 608 may part of memory component (e.g., DQ unit 306 and DQS terminals 308 and 310), channel 606 may include channel 305, and host 604 may include host 304. Similar to memory system 500 of FIG. 5, each transistor M of memory system 600 may be individually controlled (i.e., turned on/off) based on an associated operation signal. Each driver 608 may include a resistor R coupled between a terminal (e.g., a source or a drain) of an associated transistor M and node N, which may include an output node (e.g., a DQ node). As will be appreciated, in some embodiments (e.g., wherein output resistance Ron is relatively small), resistors R may not be necessary.

As will be appreciated, each driver 608 may be configured based on a calibration code. In other words, a calibration code may be associated with and/or be indicative of a driver configuration of one or more drivers 608. For example, a calibration code of "one" may be associated with and/or be indicative of a driver configuration wherein "one" transistor of driver 608 is selected (i.e., to conduct). As another example, a calibration code of "five" may be associated with and/or be indicative of a driver configuration wherein "five" transistors of driver 608 are selected (i.e., to conduct).

ZQ calibration circuit 602 includes logic 610 (also referred to herein as "ZQ calibration logic" or "calibration logic"), a register 612, logic 614, and a register 616. According to some embodiments, logic 610 may include a replica output buffer coupled to resistor RZQ (see FIG. 2) to perform a ZQ calibration operation. ZQ calibration circuit 602 also includes a compute block (e.g., add and/or subtract block) 618 and a latch 620. According to some embodiments, each of register 612 and register 616 may be configured to store one or more values (e.g., calibration codes and/or shift values). Further, logic 614 may be configured to compare two values (e.g., two calibration codes) and determine a difference between the values. More specifically, for example, as described more fully below, logic 614 may be configured to compare an initial calibration code (e.g., generated during power-up of memory system 600 and in response to a "long calibration" operation) to a calibration code determined via a training operation (also referred to herein as a "testing result," a "testing result calibration code," a "testing result code" or some variation thereof) (e.g., performed during power-up of memory system 600) to determine a difference (also referred to herein as an "shift value" or an "offset") between the initial calibration code and the training result calibration code. In other embodiments, another component and/or device (e.g., host 604) may be configured to determine a difference between two calibration codes. For example, the difference between the initial ZQ calibration code and the training result calibration code may be stored in register 616 as a shift value. As non-limiting example, the shift value may be one of "+1," "−1," "+2," "−2," "+3," "−3," and so on.

Compute block 618 may be configured to receive an input value (e.g., a calibration code generated during operation of memory system 600 and in response to a "short calibration" operation) from register 612, add or subtract the shift value (i.e., based on a signal received from register 616) to or from the input value, and generate an output value that may be used as a calibration code to configure one or more unit drivers 608.

As a non-limiting example, during operation (e.g., during an operational mode) of memory system 600, compute block 618 may be configured to receive a calibration code of "5" from register 612, subtract a value of "1" from the calibration code (i.e., the shift value is "−1"), and generate an updated calibration code of "4" (i.e., 5−1=4). As another non-limiting example, compute block 618 may be configured to receive a calibration code of "7" from register 612, add a value of "2" to the calibration code (i.e., the shift value is "+2"), and generate an updated calibration code of "9" (i.e., 7+2=9). As will be appreciated by a person having ordinary skill in the art, latch 620 may receive an input from compute block 618, store a value, and output a signal that may be used to configure unit driver 608 based on the calibration code generated via compute block 618.

According to some embodiments, each unit driver 608 of memory system 600 may be associated with dedicated ZQ calibration circuitry (e.g., logic 610, registers 612 and 616, logic 614, compute block 618, and/or latch 620). In other embodiments, more than one unit driver 608 may be associated with (e.g., supported by) the same ZQ calibration circuitry (e.g., logic 610, registers 612 and 616, logic 614, compute block 618, and/or latch 620). As illustrated in FIG. 6, host 604 is coupled to driver 608 via channel 606 (e.g., for receiving various signals). Further, according to some embodiments, host 604 may be coupled to (e.g., register 612) ZQ calibration circuit 602.

A contemplated, non-limiting example operation of memory system 600 will now be described. In response to a calibration operation (e.g., a "long calibration operation") during power-up (e.g., during a power-up mode) of memory system 600, register 612 may be received and stored a calibration code (an "initial calibration code"). In some embodiments, host 604 may convey the initial calibration code to logic 610, which may provide the calibration code to register 612. In other embodiments, the initial calibration code may be received from another device (i.e., other than host 604). More specifically, for example, in response to a calibration command, ZQ calibration circuit 602 may receive a calibration signal (e.g., DOZQCAL of FIG. 2) and perform a calibration operation (e.g., a long calibration operation) by referencing an impedance of a reference resistor (e.g., resistor RZQ of FIG. 2) and a reference potential (e.g., ZQVREF of FIG. 2) to generate a calibration code. Further, in these embodiments, the calibration code may be provided to one or more unit drivers 608 for selecting a number of transistors M (e.g., 1-N transistors are selected to be turned ON (i.e., to conduct)). In other embodiments, logic 610 and/or register 612 may not be necessary (i.e., for providing a calibration code to driver 608), and, in these embodiments, host 604 may convey the initial calibration code to one or more unit drivers 608 for selecting the number of transistors M.

Further, according to various embodiments, memory system 600 may be configured to determine (e.g., during power-up), via testing, a value of output resistance Ron that enhances, and possibly optimizes (i.e., at least for a portion of operation of memory system 600), the signal integrity associated with channel 606. More specifically, for example, memory system 600 may be configured to test a number of values for output resistance Ron (e.g., based on a number of calibration codes) to determine an optimal value for Ron of the number of Ron values.

For example, a sweep of a number of possible calibration codes may be performed (e.g., during power-up) to identify an optimal calibration code. In some examples, an optimal calibration code may be determined (e.g., during power-up of memory system 600) via a testing process performed via host 604 and ZQ calibration circuit 602 and/or driver 608. More specifically, for example, with a selected number of transistors conducting (e.g., based on the initial calibration code), a signal may be transmitted from driver 608 to host 604 (i.e., data may be read from driver 608), and a channel performance response may be measured and/or evaluated. For example, a size of a data eye of the channel performance response may be measured and/or evaluated. Further, with a different selected number of transistor conducting (e.g., based on another calibration code), a signal may be transmitted from driver 608 to host 604 (i.e., data may be read from driver 608), and a channel performance response may be measured and/or evaluated. Moreover, the channel performance response may be compared to a previous channel performance response. If the channel performance response is improved compared to a previous channel performance response (i.e., a previous channel performance response associated with initial calibration code), the associated calibration code may be stored (e.g., in register 612). For example, in response to determining that a channel performance response is improved relative to a previous channel performance response, host 604 may convey a signal to ZQ calibration circuit 602 to instruct ZQ calibration circuit 602 to store an associated calibration code (e.g., in register 612). On the other hand, if the channel performance response is not improved compared to a previous channel performance response (i.e., a previous channel performance response associated with the initial calibration code), the associated calibration code may not be stored.

This calibration ("training" or "testing") process may be repeated for each of a number of calibration codes such that a channel performance response for each of a number of transistor configurations (e.g., one transistor conducting, two transistors conducting, three transistors conducting, and so on) of driver 608 is generated and measured and/or evaluated, and a testing result calibration code associated with a desired (e.g., optimal) channel performance response is determined (e.g., and stored in register 612). Additional description regarding an example testing operation that may be used (e.g., during power-up) to determine an optimal calibration code (i.e., to improve signal integrity) is included in U.S. patent application Ser. No. 17/141,031, filed Jan. 4, 2021, titled "Output Impedance Calibration, and Related Devices, Systems, and Methods." Further, after power-up (e.g., during operation of memory system 600), unit driver 608 may be configured based on the testing result calibration code that generated the best channel performance response (i.e., during the calibration/testing process).

Further, according to various embodiments, the optimal calibration code (the "testing result calibration code") associated with the determined Ron value may be compared (e.g., via logic 614) to the initial calibration code (e.g., the code generate in response to a long calibration operation), and a difference between the initial calibration code and the testing calibration code may be stored in register 616 (e.g., as a "shift value").

As will be appreciated, one or more conditions (e.g., voltage and/or temperature) of memory system 600 may vary (e.g., depending on a mode of memory system 600). More specifically, a voltage and/or a temperature of memory system 600 during power-up may be different than the voltage and/or temperature of memory system 600 during operation. Thus, as will also be appreciated, after power-up and during operation of memory system 600, another calibration operation may be performed.

Continuing with the example operation of memory system 600, in response to a calibration command during operation (e.g., a short calibration command), another calibration operation may be performed and another calibration code may be determined and stored in register 612. Further, according to some embodiments of the disclosure, the calibration code (e.g., determined during operation) may be updated (e.g., via compute block 618) based on the shift value stored in register 616. Further, the updated calibration code may be used to configure one or more unit drivers 608.

Thus, as will be appreciated, one or more unit drivers of memory system 600 may be tuned (i.e., during operation) based on the shift value stored in register 616 (e.g., and without feedback from host 604). In other words, one or more unit drivers of memory system 600 may be tuned (i.e., during operation and without feedback from host 604) based, at least partially on, a calibration code (i.e., determined via a previously performed testing operation (e.g., a testing operation performed during power-up and via host 604)) that improved signal integrity of memory system 600 during power-up.

Figure 7A:
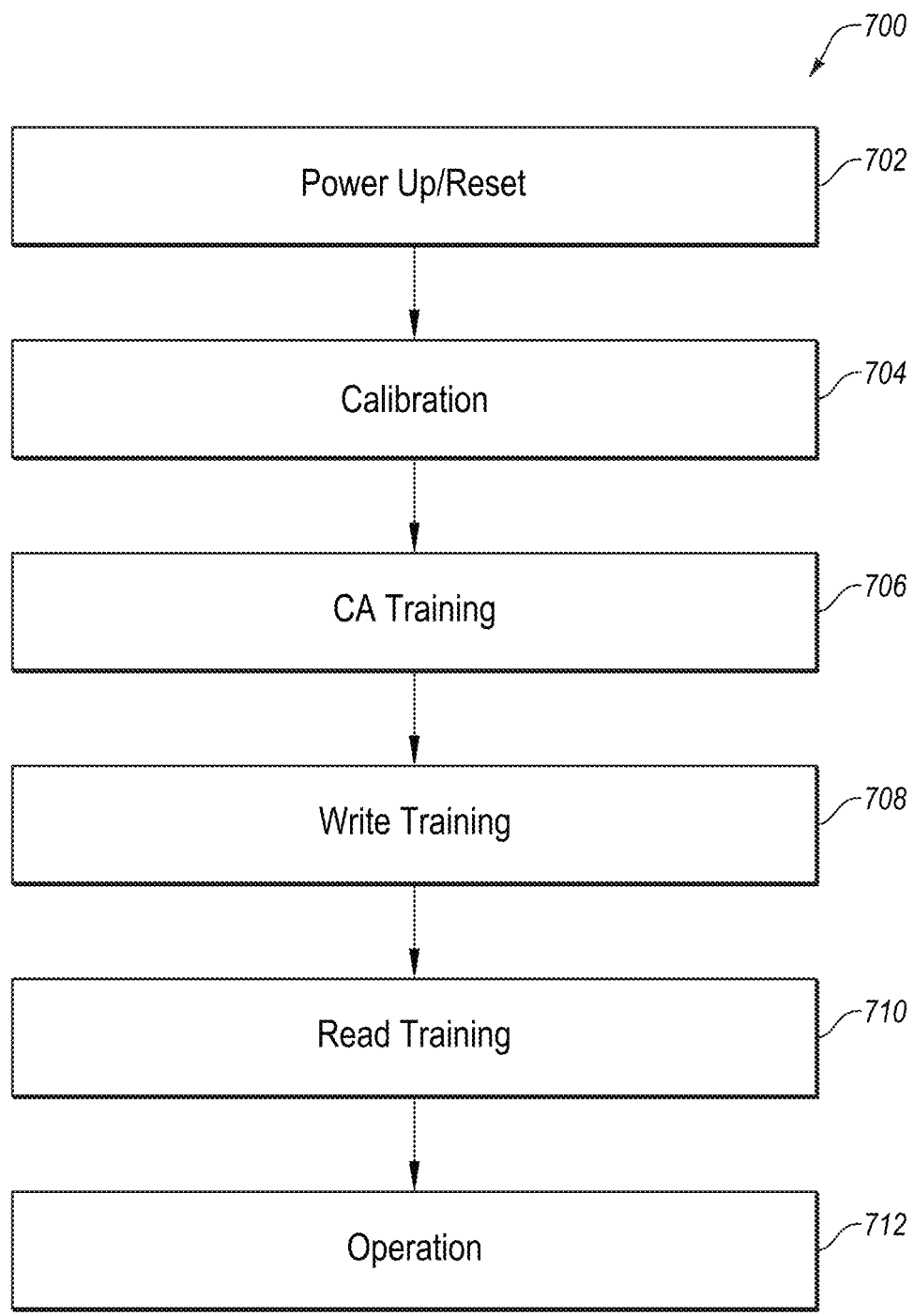
FIG. 7A is a flowchart illustrating an example method of operating a memory system, in accordance with various embodiments of the disclosure.

FIG. 7A is a flowchart of an example method 700 of operating a memory system. More specifically, method 700 may be used for initializing and/or calibrating a memory system. Method 700 may be arranged in accordance with at least one embodiment described in the disclosure. Method 700 may be performed, in some embodiments, by a device or system, such as memory system 100 of FIG. 1, one or more memory devices of memory system 100, memory device 200 of FIG. 2, memory system 300 of FIG. 3, memory system 600 of FIG. 6, memory system 900 of FIG. 9, electronic system 1000 of FIG. 10, or another device or system. Although illustrated as discrete blocks, various blocks may be divided into additional blocks, combined into fewer blocks, or eliminated, depending on the desired implementation.

Method 700 may begin at block 702, wherein a memory system (e.g., memory system 600 of FIG. 6) may be powered up or reset, and method 700 may proceed to block 704. At blocks 704, 706, and 708, various calibration and/or training operations for the memory system may be performed. More specifically, for example, as will be appreciated by a person having ordinary skill in the art, at block 704, ZQ calibration may be performed (e.g., with a replica buffer in ZQ calibration circuit 223 and resistor RZQ; see FIG. 2), at block 706, command-and-address (CA) training may be performed, and at block 708, write training may be performed.

Further, at block 710, read training, in accordance with various embodiments of the disclosure, may be performed. With reference to a flowchart depicted in FIG. 7B, an example method 720 of performing read training of a memory device will now be described. Method 720 may be arranged in accordance with at least one embodiment described in the disclosure. Method 720 may be performed, in some embodiments, by a device or system, such as memory system 100 of FIG. 1, one or more memory devices of memory system 100, memory device 200 of FIG. 2, memory system 300 of FIG. 3, memory system 600 of FIG. 6, memory system 900 of FIG. 9, electronic system 1000 of FIG. 10, or another device or system. Although illustrated as discrete blocks, various blocks may be divided into additional blocks, combined into fewer blocks, or eliminated, depending on the desired implementation.

At block 722, one or more data and/or clock timing alignment operations may be performed, as will be appreciated, and method 720 may proceed to block 724. At block 724, a calibration code may be determined and used to configure a unit driver, and method 720 may proceed to block 726. For example, in response to a calibration command, a ZQ calibration circuit (e.g., ZQ calibration circuit 602 of FIG. 6) may receive a calibration signal (e.g., DOZQCAL of FIG. 2) and perform a calibration operation (e.g., a long calibration operation) by referencing an impedance of a reference resistor (e.g., resistor RZQ of FIG. 2) and a reference potential (e.g., ZQVREF of FIG. 2). Further, the ZQ calibration circuit may provide a ZQ calibration code (i.e., generated via the calibration operation) to input/output circuit 262 (see FIG. 2) for configuring a number of circuits based on the ZQ calibration code. More specifically, in response to the ZQ calibration code, a number of transistors (e.g., 1, 2, 3, etc.) of a unit driver (e.g., unit driver 608 of FIG. 6) may be turned ON (i.e., to adjust output resistance Ron).

At block 726, in response to a signal being conveyed from driver 608 to host 604 (e.g., data being read out via host 608), a channel performance response (i.e., for the calibration code and associated configuration) may be measured (e.g., via host 604 of FIG. 6). For example, a size (e.g., a height and/or width) of an eye of the channel performance response may be measured. Further, at block 728, the calibration code may be updated (e.g., increased or decreased by one (1)), and method 720 may return to block 726. As will be appreciated, blocks 726 and 728 may be repeated for each calibration code of a number of calibration codes (e.g., a calibration code sweep may be performed). More specifically, a number of driver configurations (e.g., including 1-N conducting transistors) may be tested for a number of (e.g., N) of calibration codes. After each possible calibration code is tested, a testing result calibration code (i.e., a code that optimizes the signal integrity) may be determined, a difference between the initial calibration code and the testing result calibration code may be determined, and, at block 730, the difference between the initial calibration code and the testing result calibration code (i.e., a shift value) is stored (e.g., in register 616 of FIG. 6). At block 732, one or more reference voltage training operations may be performed.

With reference again to FIG. 7A, upon completion of the read training operations at block 710, method 700 may proceed to block 712, wherein the memory system may operate (e.g., perform various operations, such as, for example, read, write, refresh, etc.).

Figure 7C:
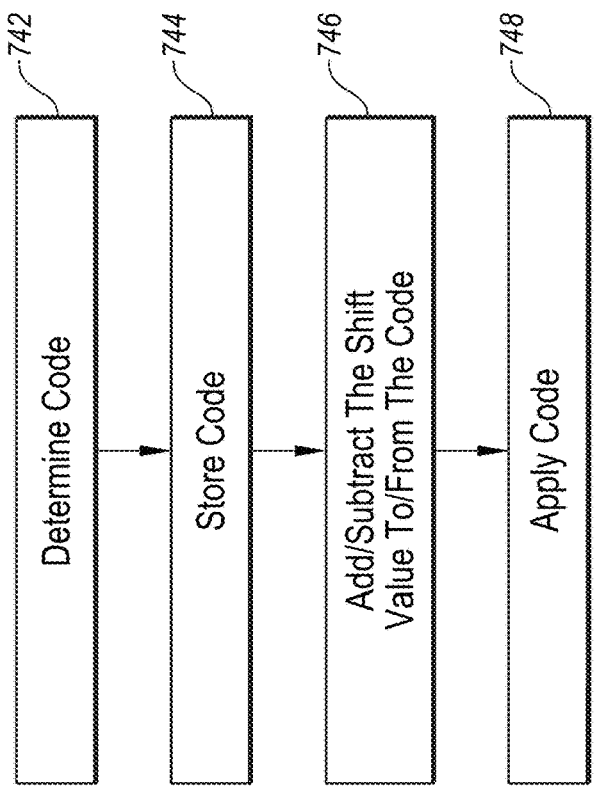
FIG. 7C is a flowchart illustrating an example method of calibrating a memory device, according to various embodiments of the disclosure.
Figure 7B:
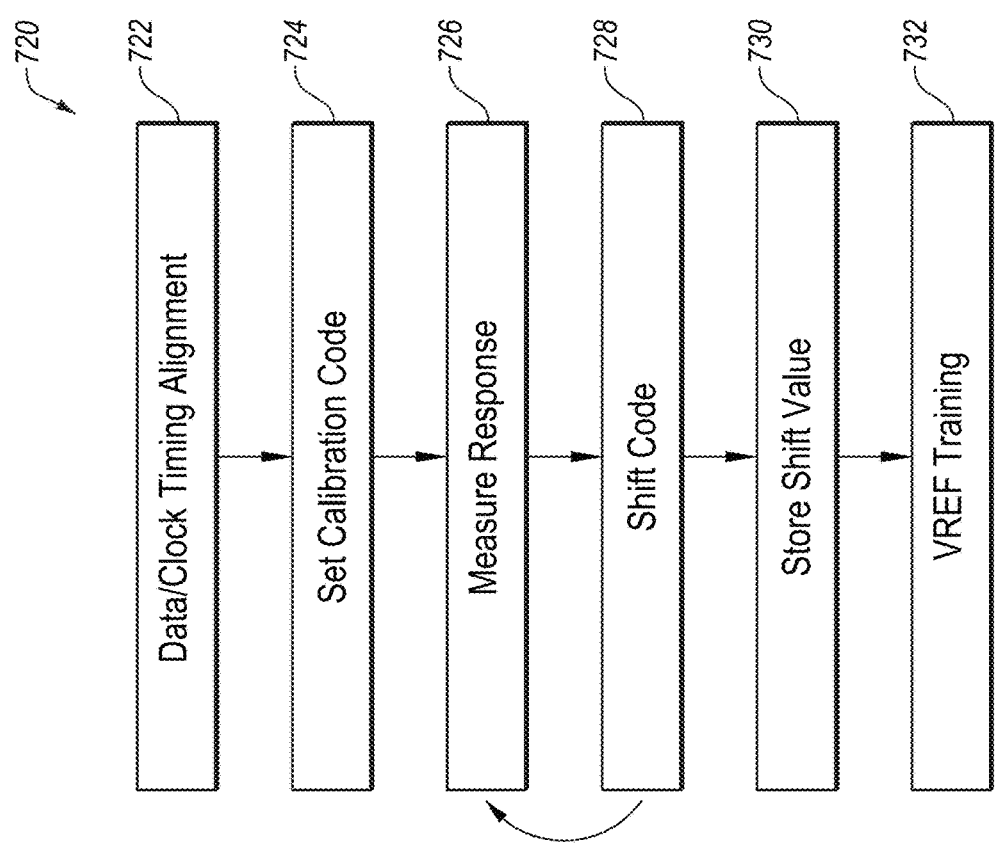
FIG. 7B is a flowchart illustrating an example method of performing read training of a memory device, in accordance with various embodiments of the disclosure.

FIG. 7C is a flowchart of an example method 740 of calibrating a memory device. More specifically, method 740 may be used for calibrating a memory device (e.g., during operation of the memory device). Method 740 may be arranged in accordance with at least one embodiment described in the disclosure. Method 740 may be performed, in some embodiments, by a device or system, such as memory system 100 of FIG. 1, one or more memory devices of memory system 100, memory device 200 of FIG. 2, memory system 300 of FIG. 3, memory system 600 of FIG. 6, memory system 900 of FIG. 9, electronic system 1000 of FIG. 10, or another device or system. Although illustrated as discrete blocks, various blocks may be divided into additional blocks, combined into fewer blocks, or eliminated, depending on the desired implementation.

Method 740 may begin at block 742, wherein a calibration code may be determined, and method 740 may proceed to block 744. More specifically, in response to a "short calibration" command (i.e., during operation of the memory device), a calibration operation may be performed and the calibration code may be determined. At block 744, the calibration code may be stored, and method 740 may proceed to block 746. For example, the calibration code may be stored in register 612 of ZQ calibration circuit 602 (see FIG. 6).

At block 746, the calibration code may be updated based on a predetermined shift value, and method 740 may proceed to block 748. For example, the calibration code may be updated based on the shift value stored at block 730 of FIG. 7B. As a non-limiting example, if the calibration code (e.g., determined in response to a short calibration command) is five (5) and the shift value is positive one (+1), the calibration code may be updated to be six (6). As another non-limiting example, if the calibration code is five (5) and the shift value is negative three (−3), the calibration code may be updated to be two (2).

At block 748, the updated calibration code may be applied to one or more unit drivers of an output driver of a memory device. For example, the updated calibration code may be used to configure one or more transistors of unit driver 608 of FIG. 6.

Modifications, additions, or omissions may be made to method 740 without departing from the scope of the disclosure. For example, the operations of method 740 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment.

As noted above, signal integrity may vary across memory components (e.g., memory devices) of memory system. Thus, according to some embodiments, one or more memory devices of a memory system (e.g., memory device of a DIMM) may be calibrated according to various embodiments disclosed herein. More specifically, for example, one or more of memory devices 102-105 (see FIG. 1) may be calibrated (i.e., individually) (e.g., via different calibration processes) according to various embodiments disclosed herein. As another example, one or more of memory components (e.g., DQ unit 306 and DQS terminals 308 and 310) of memory system 300 (see FIG. 3) may be calibrated (i.e., individually) according to various embodiments disclosed herein. In these examples, each memory component may or may not utilize the same calibration code (i.e., during operation). In other examples, a number of memory components (e.g., of a memory system) may be calibrated together (i.e., via a single calibration process). In this example, each memory component may utilize the same calibration code (i.e., during operation).

As also noted above, signal integrity may vary across components (e.g., DQ components and/or unit drivers) of a single memory device. Thus, according to various embodiments, one or more unit drivers of one or more output drivers of a memory device may be calibrated (i.e., individually) (e.g., via different calibration processes) according to various embodiments disclosed herein. Moreover, for example, one or more DQ components of a memory device may be calibrated (i.e., individually) according to various embodiments disclosed herein. For example, one or more of unit drivers 608 (see FIG. 6) may be calibrated (i.e., individually) according to various embodiments disclosed herein. In these examples, each component (e.g., each unit driver and/or DQ component) may or may not utilize the same calibration code (i.e., during operation). In other examples, a number of unit drivers and/or DQ components (e.g., of a memory device) may be calibrated together (i.e., via a single calibration process). In this example, each component may utilize the same calibration code (i.e., during operation).

Figure 8:
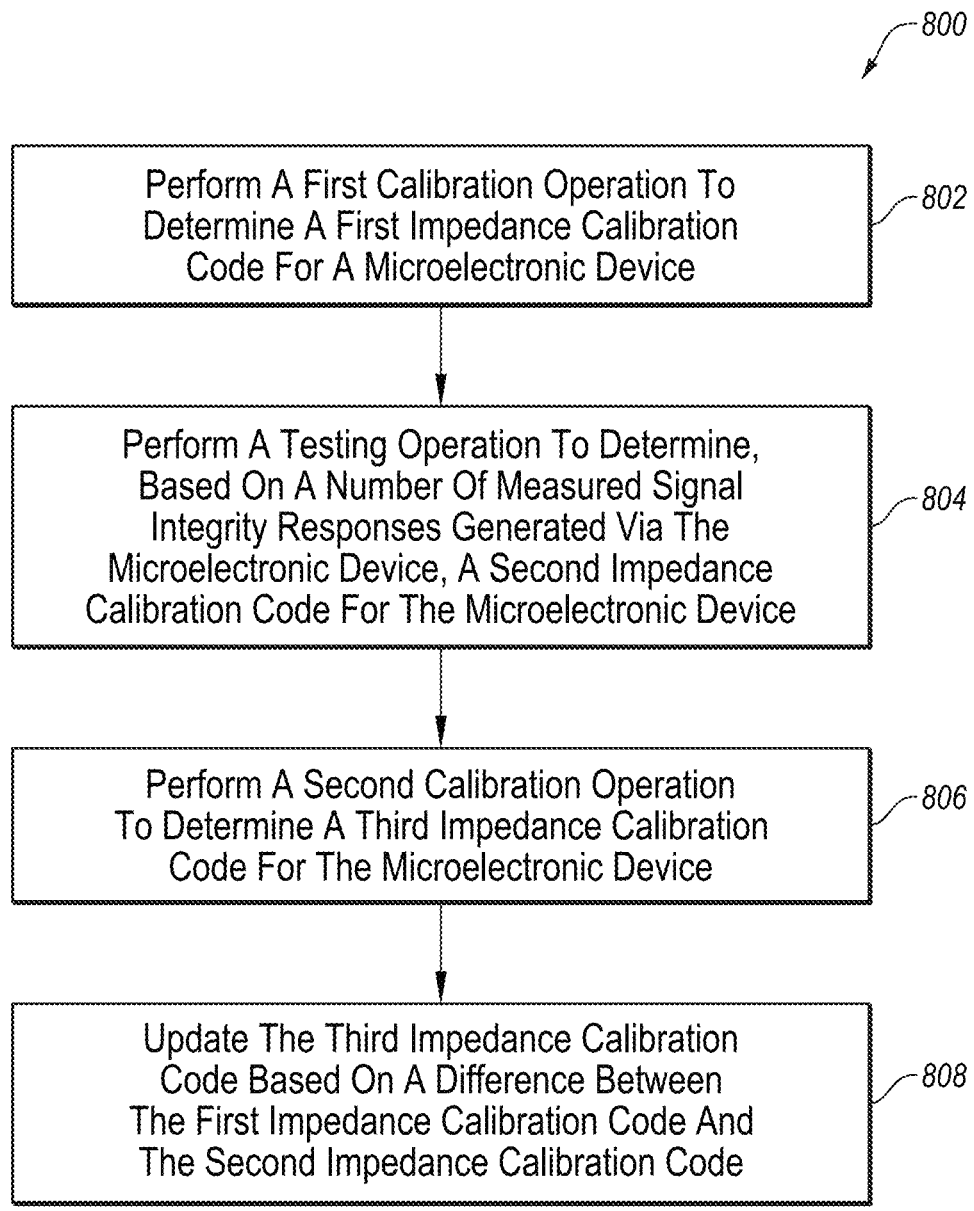
FIG. 8 is a flowchart illustrating an example method of operating a memory device, according to various embodiments of the disclosure.

FIG. 8 is a flowchart of an example method 800 of operating a memory device. Method 800 may be arranged in accordance with at least one embodiment described in the disclosure. Method 800 may be performed, in some embodiments, by a device or system, such as memory system 100 of FIG. 1, one or more memory devices of memory system 100, memory device 200 of FIG. 2, memory system 300 of FIG. 3, memory system 600 of FIG. 6, memory system 900 of FIG. 9, electronic system 1000 of FIG. 10, or another device or system. Although illustrated as discrete blocks, various blocks may be divided into additional blocks, combined into fewer blocks, or eliminated, depending on the desired implementation.

Method 800 may begin at block 802, wherein a first calibration operation may be performed to determine a first impedance calibration code for a memory device, and method 800 may proceed to block 804. For example, in response to a long calibration command, the first calibration operation may be performed (e.g., during a first mode, such as a power-up mode of the memory device) to determine the first impedance calibration code. Yet more specifically, for example, in response to a calibration command, a ZQ calibration circuit (e.g., ZQ calibration circuit 602 of FIG. 6) may receive a calibration signal (e.g., DOZQCAL of FIG. 2) and perform a calibration operation (e.g., a long calibration operation) by referencing an impedance of a reference resistor (e.g., RZQ of FIG. 2) and a reference potential (e.g., ZQVREF of FIG. 2). Further, the ZQ calibration circuit may provide a ZQ calibration code (i.e., generated via the calibration operation) to input/output circuit 262 (see FIG. 2) for configuring a number of circuits based on the ZQ calibration code.

At block 804, a testing operation may be performed to determine a second impedance calibration code for the memory device based on a number of measured signal integrity responses of the memory device, and method 800 may proceed to block 806. For example, a number of possible calibration codes may be tested (e.g., one by one) (e.g., via host 604 of FIG. 6) (e.g., during the first mode of the memory device) to determine the second calibration code, which, as noted above, may optimize a signal integrity response of the memory device (e.g., during power-up).

At block 806, a second calibration operation may be performed to determine a third impedance calibration code for the memory device, and method 800 may proceed to block 808. For example, in response to a short calibration command, the second calibration operation may be performed (e.g., during a second mode, such as an operational mode of the memory device) to determine the third impedance calibration code.

At block 808, the third impedance calibration code may be updated based on a difference between the first impedance calibration code and the second impedance calibration code. For example, during the second mode of the memory device, the third impedance calibration code may be updated based on the shift value (e.g., stored in register 616 of FIG. 6), which is indicative of the difference between the first impedance calibration code and the second impedance calibration code. Yet more specifically, the shift value may be added to or subtracted from the third calibration code (e.g., via compute block 618 of FIG. 6) to update the third calibration code.

Modifications, additions, or omissions may be made to method 800 without departing from the scope of the disclosure. For example, the operations of method 800 may be implemented in differing order. Furthermore, the outlined operations and actions are only provided as examples, and some of the operations and actions may be optional, combined into fewer operations and actions, or expanded into additional operations and actions without detracting from the essence of the disclosed embodiment. For example, in various embodiments, method 800 may include determining (e.g., via logic 614 of FIG. 6) the shift value (i.e., determining the difference between the first impedance calibration code and the second impedance calibration code). Further, in various embodiments, method 800 may include storing (e.g., via register 616 of FIG. 6) the shift value (i.e., storing a value indicative of the difference between the first impedance calibration code and the second impedance calibration code). Moreover, in various embodiments, method 800 may include configuring at least one unit driver of the memory device based on the first calibration code, the second calibration code, the third calibration code, or the updated third calibration code.

A memory system is also disclosed. The memory system may include a number of memory devices. Each memory device may include one or more arrays (e.g., memory arrays) and one or more output drivers, as described herein.

Figure 9:
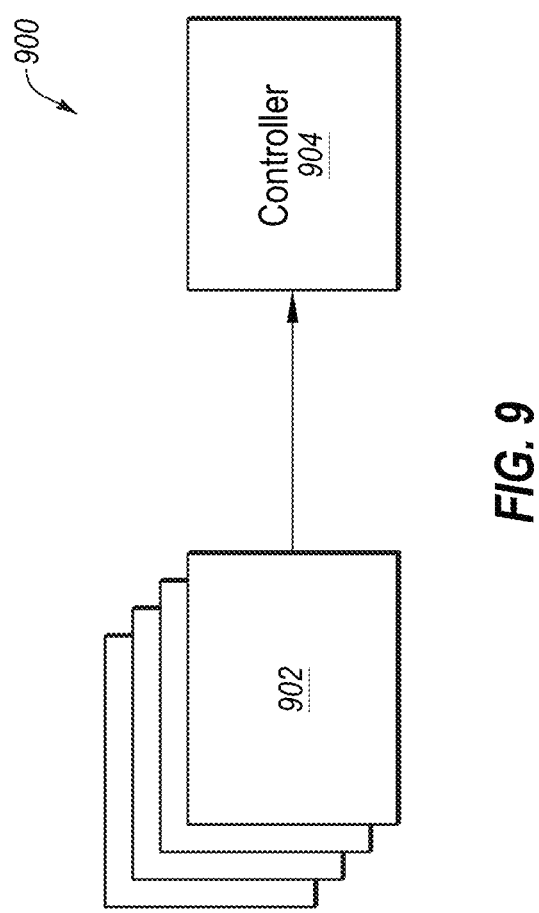
FIG. 9 is a simplified block diagram of an example memory system implemented according to one or more embodiments described herein.

FIG. 9 is a simplified block diagram of a memory system 900 implemented according to one or more embodiments described herein. Memory system 900 includes a number of memory devices 902 and a controller 904. For example, one or more of memory devices 902 may include at least a portion of memory system 600 of FIG. 6, and controller 904 may be and/or include controller 112 of FIG. 1 and/or host 604 of FIG. 6. Each memory device 902, which may include one or more memory cells, may include one or more output driver circuits including one or more unit drivers, as described herein.

Figure 10:
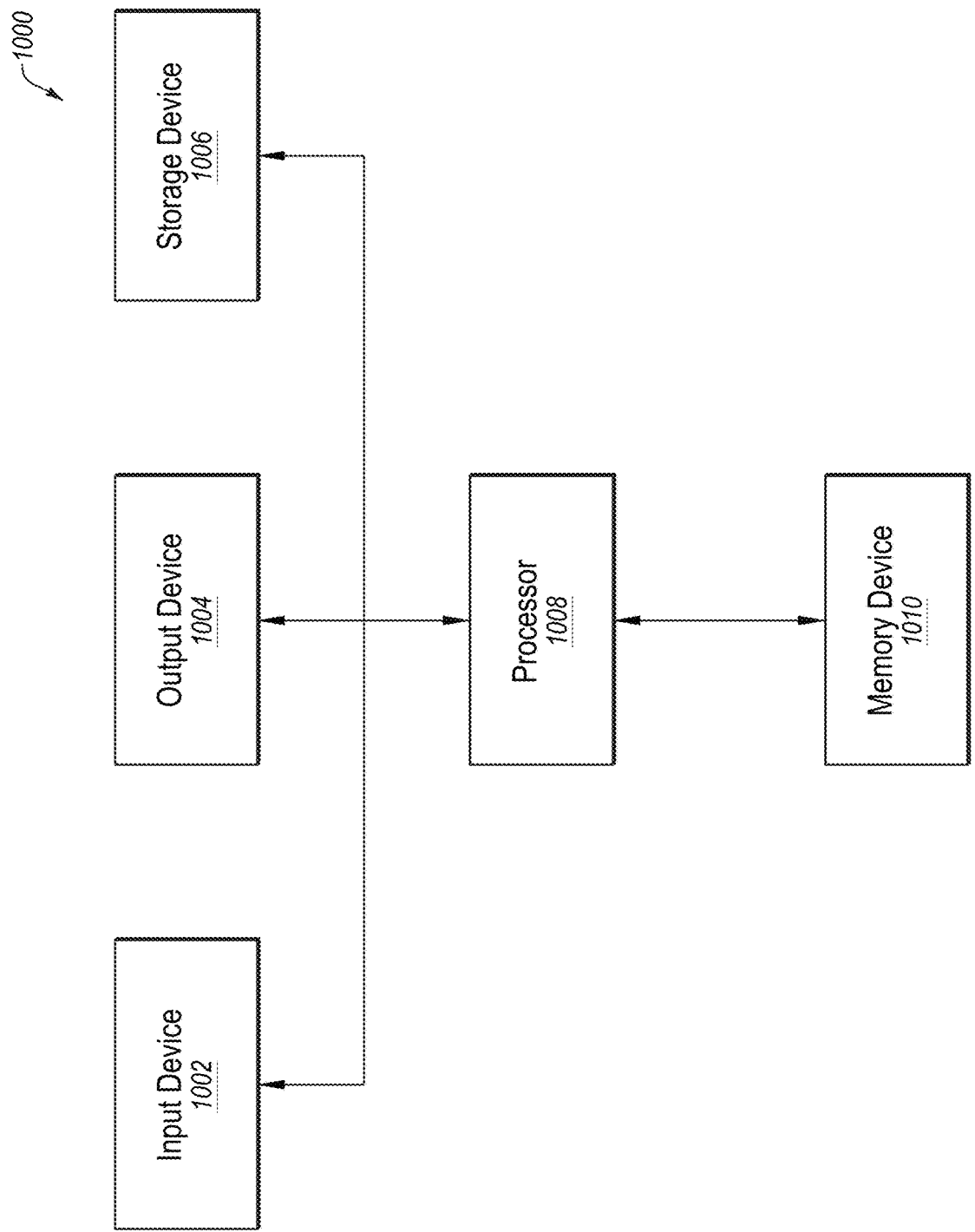
FIG. 10 is a simplified block diagram of an example electronic system implemented according to one or more embodiments described herein.

An electronic system is also disclosed. The electronic system may include a memory system including a number of memory devices. FIG. 10 is a simplified block diagram of an electronic system 1000 implemented according to one or more embodiments described herein. Electronic system 1000 includes at least one input device 1002. Input device 1002 may be a keyboard, a mouse, or a touch screen. Electronic system 1000 further includes at least one output device 1004. Output device 1004 may be a monitor, touch screen, or speaker. Input device 1002 and output device 1004 are not necessarily separable from one another. Electronic system 1000 further includes a storage device 1006. Input device 1002, output device 1004, and storage device 1006 are coupled to a processor 1008.

Electronic system 1000 further includes a memory system 1010 coupled to processor 1008. Memory system 1010, which may include memory system 900 of FIG. 9, includes a number of memory devices (e.g., memory device 102-105 of FIG. 1). Electronic system 1000 may be include a computing, processing, industrial, or consumer product. For example, without limitation, electronic system 1000 may include a personal computer or computer hardware component, a server or other networking hardware component, a handheld device, a tablet computer, an electronic notebook, a camera, a phone, a music player, a wireless device, a display, a chip set, a game, a vehicle, or other known systems.

According to various embodiments disclosed herein, and in contrast to some conventional methods, systems, and devices, a memory system may tune an output impedance of one or more unit drivers without requiring manual adjustment of the output impedance. As will be appreciated, the devices, systems, and methods disclosed herein may reduce an amount of time and/or resources that may be needed to calibrate an output impedance of one or more semiconductor devices of a system. Further, as noted above, various embodiments may allow for an output resistance Ron to be adjusted to any suitable value, even a value outside of a design specification range. Moreover, according to some embodiments, a calibration code may be updated (e.g., during operation) based on shift value determined via a previously performed testing operation (e.g., performed during power-up). The shift value may be stored at a memory device, and thus the memory device may be calibrated based on the shift value without increasing a load of an associated host (e.g., host 604).

One or more embodiments of the disclosure include a device. The device may include a ZQ calibration circuit including: a first register configured to store a first impedance code generated responsive to a ZQ calibration command; a second register configured to store a shift value; and a compute block configured to generate a second impedance code based on a third impedance code and the shift value.

Some embodiments of the disclosure include a system. The system may include a microelectronic device may include at least one driver configurable in one of a number of configurations based on a selected calibration code. The microelectronic device may also include logic for determining a difference between a first calibration code and a second calibration code of a number of calibration codes. Further, the microelectronic device may include one or more registers for storing one or more calibration codes of the number of calibration codes and a shift value indicative of the difference between the first calibration code and the second calibration code. In addition, the microelectronic device may include a compute block for adjusting a third calibration code of the number of calibration codes based on the shift value.

Additional embodiments of the disclosure include an electronic system. The electronic system may include at least one input device, at least one output device, at least one processor device operably coupled to the input device and the output device; and at least one memory system operably coupled to the at least one processor device. The memory system may include a memory device including a driver and circuitry coupled to the driver. The circuitry may be adapted to configure the driver based on a first impedance calibration code generated in response to a first calibration operation. The circuitry may further be adapted to store a second impedance calibration code generated in response to a testing operation. Moreover, the circuitry may be configured to store a third impedance calibration code generated in response to a second calibration operation. The circuitry may also be adapted configure the driver based on a fourth impedance calibration code generated based on the third impedance calibration code and a difference between the first impedance calibration code and the second impedance calibration code.

Other embodiments of the disclosure include a method. The method may include performing a first calibration operation to determine a first impedance calibration code for a microelectronic device. The method may also include performing a testing operation to determine, based on a number of measured signal integrity responses generated via the microelectronic device, a second impedance calibration code for the microelectronic device. Further, the method may include performing a second calibration operation to determine a third impedance calibration code for the microelectronic device. Moreover, the method may include updating the third impedance calibration code based on a difference between the first impedance calibration code and the second impedance calibration code.

In accordance with common practice, the various features illustrated in the drawings may not be drawn to scale. The illustrations presented in the disclosure are not meant to be actual views of any particular apparatus (e.g., device, system, etc.) or method, but are merely idealized representations that are employed to describe various embodiments of the disclosure. Accordingly, the dimensions of the various features may be arbitrarily expanded or reduced for clarity. In addition, some of the drawings may be simplified for clarity. Thus, the drawings may not depict all of the components of a given apparatus (e.g., device) or all operations of a particular method.

Terms used herein and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. As used herein, "and/or" includes any and all combinations of one or more of the associated listed items.

In addition, even if a specific number of an introduced claim recitation is explicitly recited, it is understood that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc.," is used, in general such a construction is intended to include A alone, B alone, C alone, A and B together, A and C together, B and C together, or A, B, and C together, etc. For example, the use of the term "and/or" is intended to be construed in this manner.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additionally, the use of the terms "first," "second," "third," etc., are not necessarily used herein to connote a specific order or number of elements. Generally, the terms "first," "second," "third," etc., are used to distinguish between different elements as generic identifiers. Absence a showing that the terms "first," "second," "third," etc., connote a specific order, these terms should not be understood to connote a specific order. Furthermore, absence a showing that the terms "first," "second," "third," etc., connote a specific number of elements, these terms should not be understood to connote a specific number of elements.

The embodiments of the disclosure described above and illustrated in the accompanying drawings do not limit the scope of the disclosure, which is encompassed by the scope of the appended claims and their legal equivalents. Any equivalent embodiments are within the scope of this disclosure. Indeed, various modifications of the disclosure, in addition to those shown and described herein, such as alternative useful combinations of the elements described, will become apparent to those skilled in the art from the description. Such modifications and embodiments also fall within the scope of the appended claims and equivalents.

What is claimed is:

1. A device, comprising:
 a ZQ calibration circuit including:
  a first register configured to store a first impedance code generated responsive to a ZQ calibration command;
  logic for determining a shift value based on the first impedance code;
  a second register configured to store the shift value; and
  a compute block configured to generate a second impedance code based on a third impedance code and the shift value.

2. The device of claim 1, wherein the logic is configured to determine the shift value indicative of a difference between the first impedance calibration code and a fourth impedance calibration code.

3. The device of claim 2, wherein the logic is configured to convey a signal indicative of the shift value to the second register.

4. The device of claim 2, wherein the compute block is configured to either add or subtract the shift value to or from the third impedance calibration code to generate the second impedance calibration code.

5. The device of claim 1, wherein the first register is configured to store the first impedance code during a power-up mode and the compute block is configured to generate the second impedance code during an operational mode.

6. The device of claim 1, wherein the ZQ calibration circuit is adapted to determine and store the shift value.

7. A system, comprising:
 a microelectronic device including:
  at least one driver configurable in one of a number of configurations based on a selected calibration code;
  logic for determining a difference between a first calibration code and a second calibration code of a number of calibration codes;
  one or more registers for storing one or more calibration codes of the number of calibration codes and a shift value indicative of the difference between the first calibration code and the second calibration code; and
  a compute block for adjusting a third calibration code of the number of calibration codes based on the shift value.

8. The system of claim 7, wherein the one or more registers includes:
 a first register configured to store at least one of the first calibration code and the second calibration code; and
 a second register coupled to the logic and configured to store the shift value.

9. The system of claim 7, further comprising a host coupled to the microelectronic device and configured to:
 convey a number of signals to the at least one driver to configure the at least one driver in each configuration of a number of configurations;
 evaluate a signal integrity response for each configuration of the number of configurations to select a configuration of the number of configurations; and
 convey a signal to the microelectronic device to store the second calibration code associated with the selected configuration.

10. The system of claim 7, wherein the compute block is configured to either add or subtract the shift value to or from the third calibration code to adjust the third calibration code.

11. The system of claim 7, wherein the first calibration code and the second calibration code are determined during power-up of the microelectronic device, and the third calibration code is determined during operation of the microelectronic device.

12. The system of claim 7, wherein the first calibration code is determined in response to a first calibration command, and the third calibration code is determined in response to a second calibration command.

13. A system, comprising:
 at least one input device;
 at least one output device;
 at least one processor device operably coupled to the input device and the output device; and
 at least one memory system operably coupled to the at least one processor device, the memory system comprising:

a memory device including:
a driver; and
circuitry coupled to the driver and adapted to:
- configure the driver based on a first impedance calibration code generated in response to a first calibration operation;
- store a second impedance calibration code generated in response to a testing operation;
- store a third impedance calibration code generated in response to a second calibration operation; and
- configure the driver based on a fourth impedance calibration code generated based on the third impedance calibration code and a difference between the first impedance calibration code and the second impedance calibration code.

14. The system of claim 13, the circuitry comprising:
a first register configured to store at least one of the first impedance calibration code and the second impedance calibration code;
logic configured to determine a shift value indicative of the difference between the first impedance calibration code and the second impedance calibration code;
a second register configured to store the shift value; and
a compute block configured to either add or subtract the shift value to or from the third impedance calibration code to generate the fourth impedance calibration code.

15. The system of claim 13, wherein the first impedance calibration code is generated during power-up of the memory device, and the third impedance calibration code is generated during operation of the memory device.

16. A method, comprising:
performing a first calibration operation to determine a first impedance calibration code for a microelectronic device;
performing a testing operation to determine, based on a number of measured signal integrity responses generated via the microelectronic device, a second impedance calibration code for the microelectronic device;
performing a second calibration operation to determine a third impedance calibration code for the microelectronic device; and
updating the third impedance calibration code based on a difference between the first impedance calibration code and the second impedance calibration code.

17. The method of claim 16, wherein performing the first calibration operation comprises performing the first calibration operation during power-up of the microelectronic device, and wherein performing the second calibration operation comprises performing the second calibration operation during operation of the microelectronic device.

18. The method of claim 17, wherein performing the testing operation comprises performing the testing operation during the power-up of the microelectronic device or during operation of the microelectronic device.

19. The method of claim 16, further comprising determining the difference between the first impedance calibration code and the second impedance calibration code.

20. The method of claim 16, further comprising configuring at least one unit driver of the microelectronic device based on the updated third impedance calibration code.

* * * * *